United States Patent [19]

Abita et al.

[11] Patent Number: 5,153,505
[45] Date of Patent: Oct. 6, 1992

[54] ADAPTABLE MULTIPORT TEST FIXTURE SYSTEM

[75] Inventors: Joseph L. Abita, Boyds; Jack G. Bebee, Damascus, both of Md.

[73] Assignee: The Johns Hopkins University, Baltimore, Md.

[21] Appl. No.: 787,995

[22] Filed: Nov. 5, 1991

[51] Int. Cl.$^5$ .................. G01R 31/02; H01P 3/08
[52] U.S. Cl. ................. 324/158 F; 324/158 P; 333/246
[58] Field of Search ............ 324/158 F, 158 P, 73.1; 269/296, 900, 903; 333/246, 248, 260

[56] References Cited

U.S. PATENT DOCUMENTS

| | | | |
|---|---|---|---|
| 3,775,644 | 11/1973 | Cotner et al. | 324/158 F |
| 4,045,010 | 8/1977 | Arnold | 269/315 |
| 4,365,195 | 12/1982 | Stegens | 333/246 |
| 4,808,919 | 2/1989 | Sylviane et al. | 324/158 F |
| 4,980,636 | 12/1990 | Romanofsky et al. | 324/601 |
| 5,003,254 | 3/1991 | Hunt et al. | 269/903 |
| 5,017,865 | 5/1991 | Oldfield | 333/246 |
| 5,038,100 | 8/1991 | Kushner et al. | 333/246 |

*Primary Examiner*—Vinh Nguyen
*Attorney, Agent, or Firm*—Robert E. Archibald; Mary Louise Beall

[57] ABSTRACT

The system is a fixture used to nondestructively support electrical circuits for testing. It is particularly useful for physically and electrically mounting circuits which are edge accessed. Support, positioning and contact elements are used in conjunction with a base plate grid and adjustably cooperate through a system of T slots and T shaped projections.

18 Claims, 3 Drawing Sheets

ADAPTABLE MULTIPORT TEST FIXTURE SYSTEM

STATEMENT OF GOVERNMENTAL INTEREST

The Government has rights in this invention pursuant to Contract No. N00039-89-0001 awarded by the Department of the Navy.

FIELD OF THE INVENTION

The invention is a fixture used to nondestructively support electrical circuits for testing. It is particularly useful for physically and electrically mounting circuits which are edge accessed.

BACKGROUND OF THE INVENTION

During the process of manufacturing an electric circuit or before placing the circuit in operation, the circuit usually is tested. Typically, the circuit is mounted in a custom fabricated test fixture with each different type circuit to be tested requiring its own custom fixture. Given the immense variety of electrical circuits, fixture fabrication is time consuming and expensive.

Some adjustable test fixtures have been made but their use is limited to a few variations in type or size. These fixtures have been rejected for reasons such as lack of adaptability to existing apparatus, inconsistency of electrical and physical mating to circuits, restrictions regarding size constraints and inability to characterize the fixture for de-embedding purposes.

U.S. Pat. No. 5,017,865 is specifically intended for use as test fixture for testing microwave devices provided with circuit configurations. However, it can be used with only one type of electrical connector and can test no more than two connectors of that type during a single test. This fixture is adjustable in the x and y directions (discussed below).

U.S. Pat. No. 5,003,254 is a circuit board test fixture used to test each individual circuit element using a probe or test lead. It cannot be used with the electrical connectors of the present invention.

U.S. Pat. No. 4,980,636 is a apparatus for testing monolithic microwave integrated circuits (MIMICs). It is designed to be used in conjunction with a fixed dimension chip carrier.

U.S. Pat. No. 4,808,919 is a device for characterizing microwave components and can be used with a variety of components such as a chip, a package or a hybrid circuit. It is adjustable for contact alignment in the y direction and for circuit dimension in the x direction. It is limited to use with coaxial connectors.

U.S. Pat. No. 4,045,010 is an abutment or support piece intended for use in the T slot of a machine table U.S. Pat. No. 3,775,644 is an adjustable holder for testing microstrip substrates. The holder can be adjusted to accommodate substrates of various sizes and circuit configurations. However, the fixture is only adjustable in the x direction for substrate size and in the y direction for circuit configuration.

OBJECTS OF THE INVENTION

It is an object of the present invention to produce an adjustable and adaptable test fixture for supporting and testing electrical circuits.

It is also an object of the present invention to produce a test fixture which is adjustable in the x, y and z directions wherein the three directions are orthogonal.

Another object of the invention is a test fixture which can be used to individually and rapidly test a series of the same type electrical circuits.

Still another object of the invention is a test fixture which can be used to individually and nondestructively test a series of the same type electrical circuits.

It is also an object of the invention to provide the ability to test a variety of electrical circuit types having a variety of electrical connector types.

SUMMARY OF THE INVENTION

The present invention is a fixture used to support electrical circuits for testing. It is particularly useful for physically and electrically mounting circuits which are edge accessed.

The fixture uses a base plate or matrix having a grid formed by T slots milled in the x and y planes or directions. Other elements of the fixture are provided with the same T slot(s) and/or T shaped projections. The T shaped projections are designed to cooperate with the T slots by sliding and, when the desired position is reached, locking within the T slots.

The x and y directions need not be perpendicular. The z direction is perpendicular to both the x and y directions.

Circuit supports extend perpendicular to the base in the z direction. Each circuit support is provided on its lower end with a T shaped projection or locking guide cooperating with a T slot on the base matrix grid. The circuit support slides in the T slot until the appropriate location is reached and is locked into place. The top surface of the of the circuit support directly supports the circuit and provides electrical contact while it is being tested.

The circuit supports also support the electrical connectors required to test the circuit. T shaped projections or locking guides located on an input/output (I/O) positioner and an electrical connector assembly cooperate with and lock into T slots on the circuit support and the I/O positioner respectively.

Although it is recommended that the test fixture be used with two circuit supports, each supporting the circuit and also supporting the appropriate electrical connector, several may be used depending on the size and shape of the circuit. The number of circuit supports used also depends on the number and type of circuit components and/or connectors as are present on the substrate. A circuit support need not be provided with an I/O positioner and a connector assembly but may be used in its circuit support role alone.

The test fixture is typically used in the testing of a circuit comprising circuit components on a substrate. Microwave, analog and digital electronic circuits are examples of the circuit types that may be tested in the fixture. It may be used to test multiport circuits having a variety of transmission line feed/launch types and electrical connector types such as subminiature type A (SMA), coaxial and bias connectors. Probe card like electrical contacts can also be accommodated. Closely spaced circuit components and especially microwave parts can be easily accessed.

DESCRIPTION OF THE PREFERRED EMBODIMENTS

Figure 1:
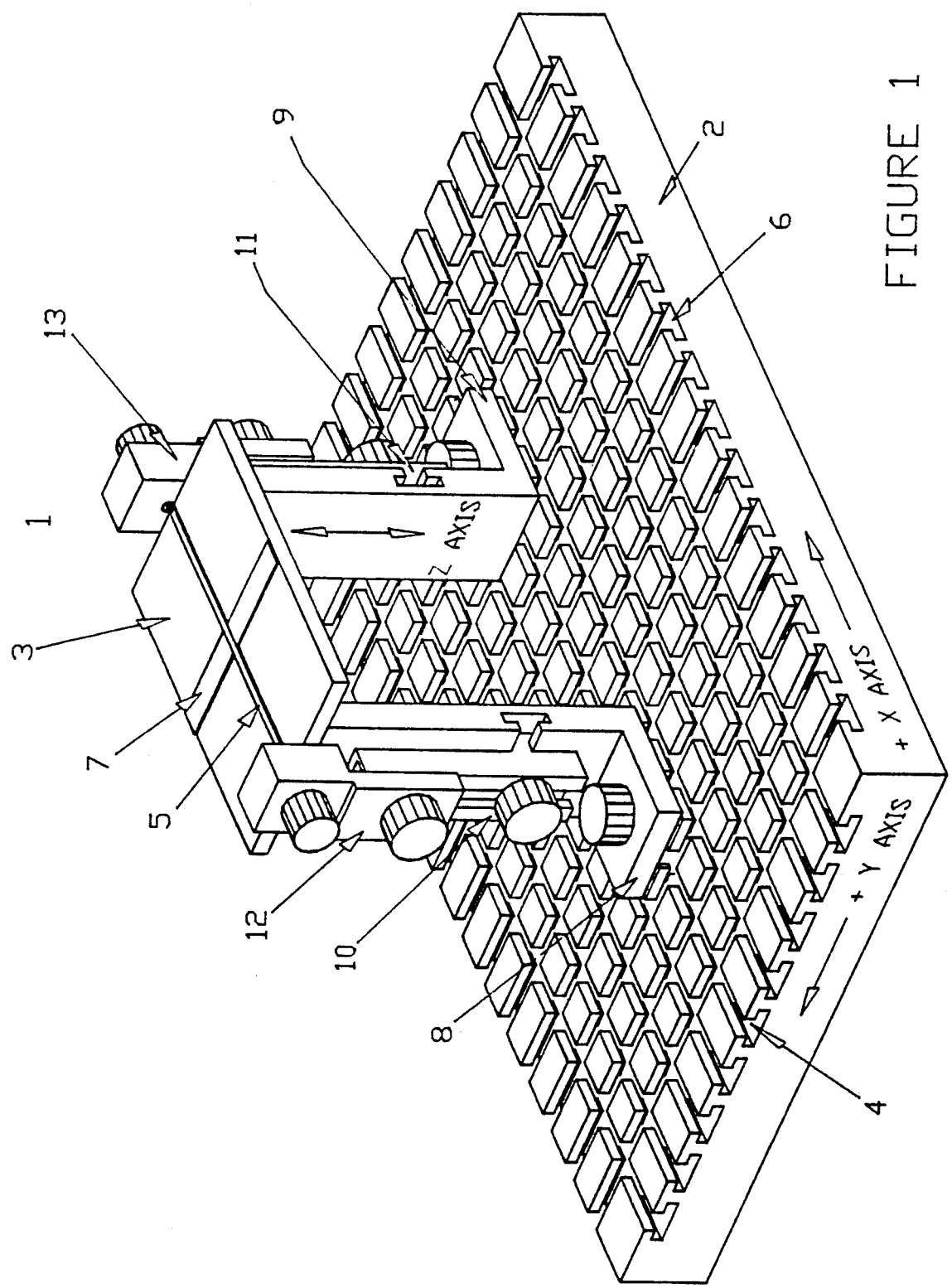
FIG. 1 is an isometric view of the test fixture of the invention.

FIG. 1 is a view of a basic embodiment of the invention wherein 2 is the base plate grid, 4 indicates one of a plurality of T slots extending in the x direction and 6 indicates one of a plurality of T slots extending in the y direction. Slots 4 and 6 are intersecting and perpendicular to one another. Circuit supports 8 and 9 are shown locked into T slot 4. I/O positioners 10 and 11 are respectively locked to circuit supports 8 and 9 and electrical connector assemblies 12 and 13 are respectively locked to I/O positioners 10 and 11. A circuit 1 comprising a circuit substrate 3 and circuit electrical components 5 and 7 is supported at two of its edges by circuit support 8.

Figure 2:
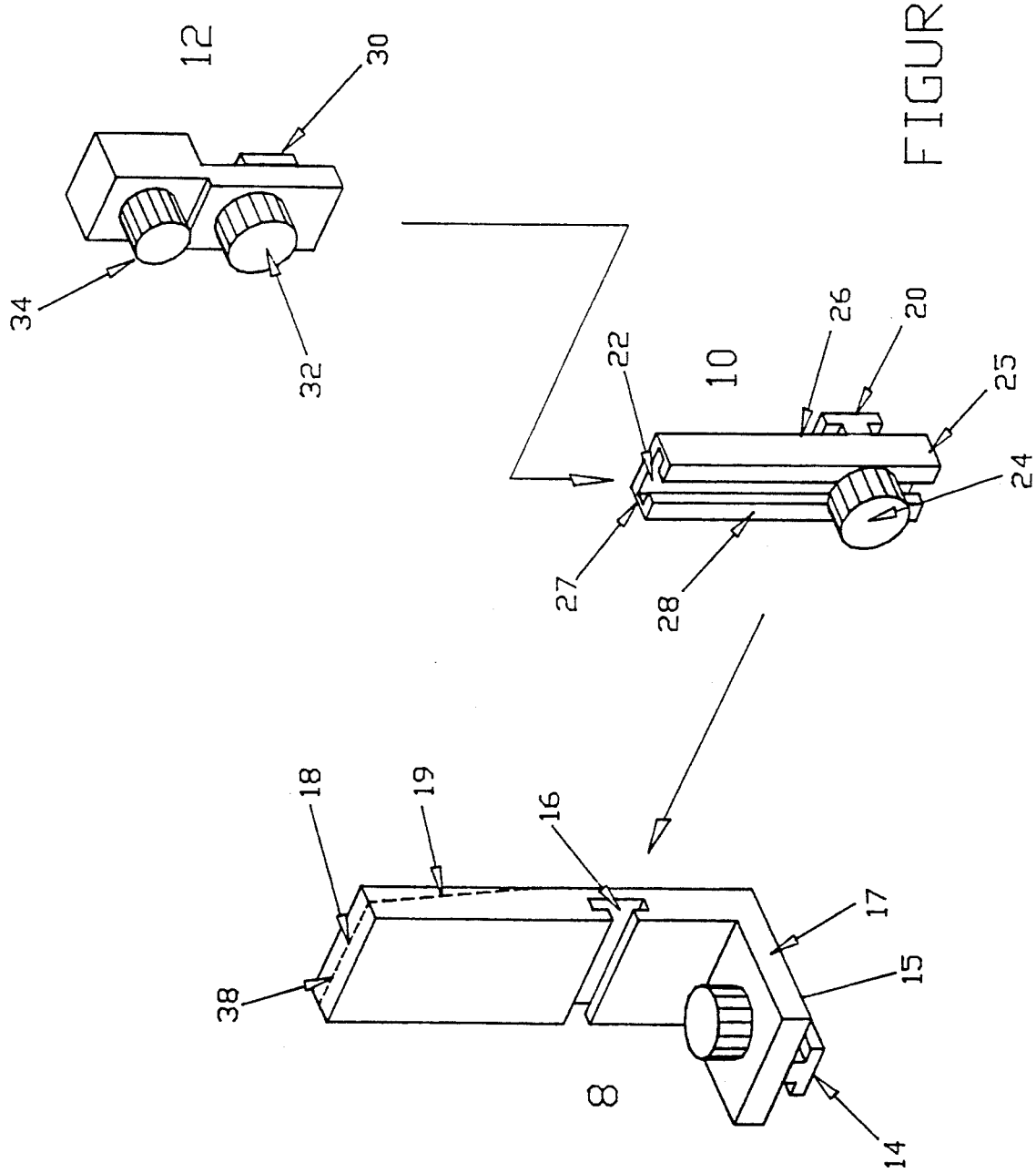
FIG. 2 is a disassembled isometric view of a complete I/O assembly according to the invention.

The assemblage of circuit support, I/O positioner and connector assembly is a complete I/O assembly. FIG. 2 is a disassembled view of the I/O assembly providing details of how circuit support 8, I/O positioner 10 and electrical connector 12 fit together.

The T shaped projection or locking guide 14 on the lower end 17 of the circuit support, generally indicated at 8, slides in a T slot on base plate 2 of FIG. 1. When support 8 reaches the desired location, it is locked into place using means operated by lock nut 15. Circuit support 8 is provided on its midsection with a horizontal T slot 16. In operation, support 8 extends in the z direction perpendicular to base plate 2 and the x and y directions; horizontal slot 16 is parallel to base plate 2 and perpendicular to the z direction. The upper end of circuit support 8 is a flat surface 18 on which rests the substrate 3 of the circuit to be tested.

It is understood that the "inside" of this invention is the portion facing the circuit to be tested. The "outside" is the portion facing away from the circuit. It is also understood that "horizontal" means parallel to the base.

The I/O positioner, generally indicated at 10, is provided on the inside 26 of its midsection with a T shaped projection 20 which cooperates with horizontal slot 16 on support 8. Positioner 10 is locked into place using means operated by lock nut 24 found on the outside 28 of the midsection opposite projection 20. Vertical T slot 22, on the outside of positioner 10, extends from the from the lower end 25 of positioner 10 to the upper end 27. In operation, slot 22 is perpendicular to base plate 2 and extends in the z direction.

The electrical connector assembly, generally indicated at 12, has an upper portion and a lower portion provided on the inside of its lower portion with a T shaped projection 30 which cooperates with vertical T slot 22 on I/O positioner 10. Connector assembly 12 is locked into place using means operated by lock nut 32 located on the outside of the lower portion opposite projection 30. Connector assembly 12 is also provided on its upper portion with an electrical connector 34, in this case an SMA connector, which is threaded into a hole pierced the through the upper portion connector assembly 12.

Figure 3:
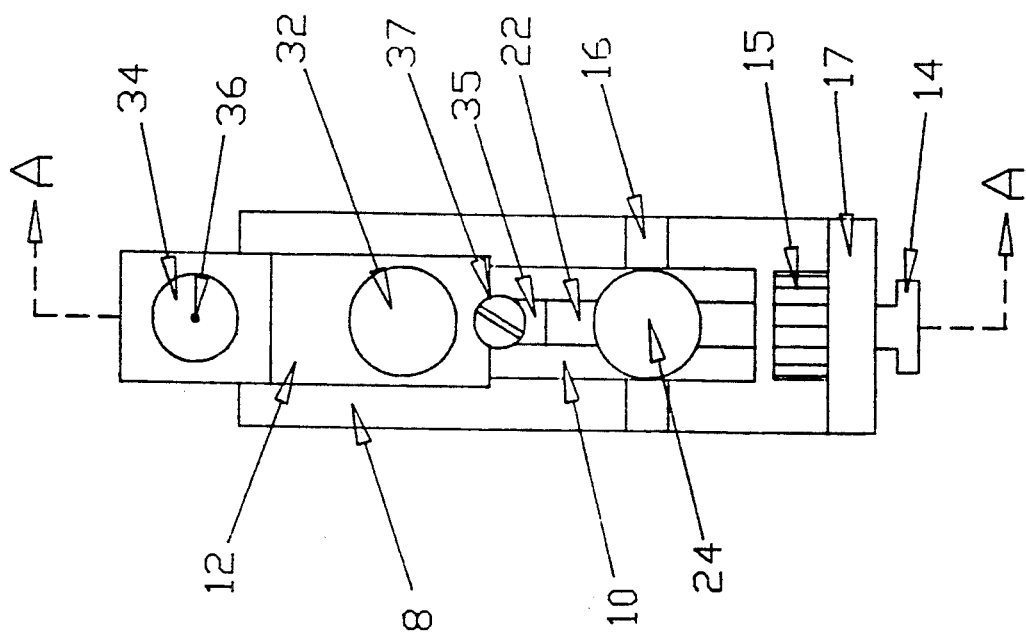
FIG. 3 is an end view of a complete I/O assembly.

An end view of the complete I/O assembly is shown in FIG. 3. Note that projection 14, cooperating with T slots 4 and 6 allows the position of circuit support 8 to be adjusted in the x and y directions. Projection 20, cooperating with horizontal T slot 16 allows the position of I/O positioner 10 to be adjusted in the x or y direction, depending on whether circuit support 8 is located an x or y direction T slot. Projection 30, cooperating with vertical T slot 22, allows the position of the electrical connector assembly to be adjusted in the z direction.

Figure 4:
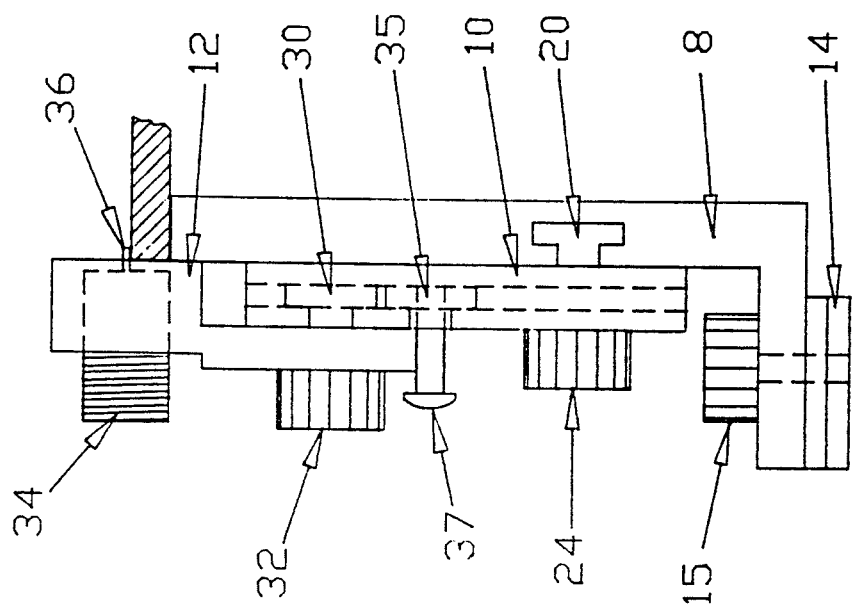
FIG. 4 is a sectional view taken along line A-A' of FIG. 3.

FIG. 4 is a sectional view of FIG. 3 taken along line A-A' and shows the operating relationship of the three elements of the I/O assembly from another angle.

Since the three elements (8, 10 and 12) of the complete I/O assembly are connected through the interaction of the various T slots (4, 6, 16 and 22) and respective T shaped projections (14, 20 and 30), when support 8 moves in the base plate grid 2, the other two elements move also. The I/O positioner 10 is able to move independently of support 8 through the interaction of T projection 20 in horizontal slot 16. However, whenever positioner 10 moves, connector assembly 12 moves also. Connector assembly 12 is able to move independently of support 8 and positioner 10 through the interaction of T projection 30 in vertical slot 22.

Thus, the position of circuit support(s) 8 is adjustable in the x and y directions which allows the fixture to be used to test electrical circuits having a wide range of dimensions. The I/O positioner(s) 10 can move horizontally in the x or y direction, depending on the location of the associated circuit support 8, providing a fine adjustment to the alignment of the associated electrical connector 12 with the circuit 1. Finally, the electrical component 12 can move vertically in the z direction to exactly position the electrical connector at the appropriate location on the circuit. This allows the fixture to be used with substrates having different thicknesses.

Thus, the test fixture of the invention is able to be adapted for use with to a wide variety of circuit types and shapes by providing five (5) separate adjustments. These five adjustments allow the test fixture to be custom tailored for each circuit tested.

In a preferred embodiment, circuit 1 to be tested is supported by at least two circuit supports as shown in FIG. 1. Supports 8 and 9 are moved into position so that their upper surfaces 18 support circuit 1. (Depending on the size and complexity of the circuit, additional supports, with or without associated connector assemblies, may be required.) The electrical connectors are SMA connectors with a threaded connector portion 34 on the outside of connector assembly 12 and a connecting pin 36 on the inside (See FIG. 4). The I/O positioners 10 and 11 are adjusted in the horizontal x or y directions to correctly align pins 36 of electrical connectors 12 and 13 with the appropriate portions of the circuit 1. Connectors 12 and 13, in a raised position for circuit insertion into the test-fixture, are lowered vertically in the z direction to place pins 36 into contact with components 5 on substrate 3.

The testing is performed. When the tests are completed, connectors 12 are raised vertically in the z direction and the tested circuit 1 is removed from the fixture. A second circuit 1 is placed in the fixture and is tested in the same manner. This continues until all of the series of circuits are tested individually.

The fixture of the preferred embodiment is able to test circuits ranging in size from 0.10 cm square to greater than 15 cm square, depending on the size of the base plate grid. Although the base of this embodiment is 9×14 cm, several bases can be connected together to provide a larger base. The minimum adjacent port separation which can be accessed is 10 mm SMA, 3.5 mm or K connector mounts. The port separation can be reduced to 5 mm using semi-rigid coaxial transmission line mounts. This device provides continuously variable positioning for arbitrary access to I/O placements. It is capable of testing multiport circuits having between two (2) and thirty-four (34) I/O placements or ports.

A major benefit of the invention resides in the ability to control or limit the pressure compression of the electrical contact, in this case pin 36, on circuit substrate 3. Depending on the composition of the substrate, it can be bent or broken by the pin if the pin pressure is too great. Moreover, if a series of circuits is tested, the pin pressure should be the same for each circuit. Since connector assembly 12, including pin 36, is raised and lowered in the z direction for each individual test, the electrical connector pressure can vary substantially.

This problem has been solved as shown in FIGS. 3 and 4 through the use of a contact z position limiter 35. This mechanical limiter 35 is a T shaped projection locked into place in vertical T slot 22 through the action of screw 37. When the connector assembly 12 is lowered into contact with the circuit, limiter 35 prevents assembly 12 from moving further than required for the proper repeatable contact to the circuit inputs and/or outputs.

The inventors have found that performance of the test fixture can be enhanced by designing the upper end of circuit support 8 to have a reduced surface area as shown in FIG. 2, dash line 38. This provides an improved consistence of grounding contact location for the device. This design forces the electrical ground mating between the connector assembly and the circuit support to occur repeatably close to the circuit base.

All contacting surfaces in the device should be properly prepared and polished flat.

The mechanism for locking the elements together by way the T slots and T projections has not been shown. Any one of several methods may be used to perform this function. In the preferred embodiment, the top of the T of the T shaped projection is squared and is connected to the shank of the T shaped projection by a screw operated by one of lock nuts 15, 24 and 32. When the element is in the proper position, the top of the T is rotated through the action of the lock nut means and the squared corners are wedged into the T slot. In another embodiment, the top of the T is elliptical which makes assists in aligning the T shape in the T slot.

The base plate grid is gold as are the various support elements. However other metal such as steel or aluminum alloys may be used.

Although the test fixture is particularly useful for physically and electrically mounting circuits which are edge accessed, the connector assembly may be modified easily to access contacts in the center portion of the circuit.

Other connecting configurations can be used in place of the T slot/T shaped projection system. In particular, the various elements can be provided with a hole slidably cooperating with a rod.

The invention described is not intended to be limited to the embodiments disclosed but includes modifications made within the true spirit and scope of the invention.

We claim:

1. An adaptable test fixture for testing electrical circuits comprising:
    a base plate having intersecting T slots, at least one of said T slots extending in the x direction and at least one of said T slots extending in the y direction;
    at least one circuit support having a lower end, a midsection and an upper end and having on its lower end a T shaped projection removably inserted into and able to slidably cooperate with the T slots in the base, and having on its midsection a horizontal T slot extending parallel to the base, said circuit support extending in the z direction perpendicular to the base and perpendicular to the x and y directions;
    at least one I/O positioner having a lower end, a midsection and an upper end and having on one side of the midsection a T shaped projection removably inserted into and able to slidably cooperate with the horizontal T slot on the circuit support and having on the opposite side of the midsection a vertical T slot extending perpendicular to the base from the lower end to the upper end, said I/O positioner extending in the z direction perpendicular to the base and perpendicular to the x and y directions; and
    at least one electrical connector assembly having an upper portion and a lower portion and having on its lower portion a T shaped projection removably inserted into and able to slidably cooperate with the vertical T slot on the I/O positioner and having on its upper portion an electrical connector, said electrical connector assembly extending in the z direction perpendicular to the base and perpendicular to the x and y directions;
    wherein:
    the upper end of the circuit support is a flat surface parallel to the x and y planes and supports the circuit to be tested;
    the I/O positioner is supported by the circuit support through the action of the I/O positioner T shaped projection in the circuit support horizontal T slot; and
    the electrical connector assembly is supported through the action of the electrical connector assembly T shaped projection in the vertical I/O positioner T slot.

2. A test fixture according to claim 1, wherein the x and y directions are perpendicular to one another.

3. A test fixture according to claim 1, comprising at least two circuit supports and wherein the electrical circuit comprises a substrate and at least one circuit electrical component.

4. A test fixture according to claim 3, wherein the position of the circuit support is adjustable in the x and y directions according to the dimensions and shape of the circuit to be tested.

5. A test fixture according to claim 4, including locking means for locking the circuit support into position on the base by locking the circuit support T shaped projection into the base T slot.

6. A test fixture according to claim 3, wherein the position of the I/O positioner is adjustable in the horizontal T slot parallel to the base to align the electrical connector with the circuit electrical component.

7. A test fixture according to claim 6, including locking means for locking the I/O positioner into position on the circuit support by locking the I/O positioner T shaped projection into the horizontal T slot on the circuit support.

8. A test fixture according to claim 6, wherein the position of the I/O positioner is adjustable parallel to the base on the circuit support to align the electrical connector with the circuit electrical component.

9. A test fixture according to claim 3, wherein the position of the electrical connector assembly is adjustable in the z direction in the vertical T slot perpendicular to the base to bring the electrical connector into electrical contact with the circuit electrical component and to adjust for variations in substrate thickness.

10. A test fixture according to claim 9, including locking means for locking the electrical connector assembly into position on the I/O positioner by locking the electrical connector assembly T shaped projection into the vertical T slot on the I/O positioner.

11. A test fixture according to claim 9, wherein the test fixture is used to test a series of a single type of circuit, and including a contact limiter comprising a T shaped projection locked into place in the z direction in the vertical T slot to prevent the electrical connector assembly from moving further than required toward the circuit to insure that the electrical contact conditions are repeatable for all circuits tested.

12. A test fixture according to claim 1, wherein the flat surface of the upper end of the circuit support is reduced in area.

13. A test fixture according to claim 1, wherein the T shaped projections are locked in their respective cooperation T slots using a mechanism wherein the top of the T shaped projection is squared and is connected to the shank of the T shaped projection by lock nut means and further wherein the lock nut means rotates the squared top of the T to wedge the top of the T in the T slot.

14. An adaptable test fixture for testing an electrical circuit comprising:
a base plate;
at least one circuit able to slidably cooperate with the base and able to lock into position on the base, said circuit support extending in the z direction perpendicular to the base;
at least one I/O positioner able to slidably cooperate with the circuit support, said I/O positioner extending in the z direction perpendicular to the base; and
at least one electrical connector assembly able to slidably cooperate with the I/O positioner and having an electrical connector, said electrical connector assembly extending in the z direction perpendicular to the base;
wherein:
the circuit support comprises a flat surface parallel to the base, said surface supporting the circuit to be tested;
the I/O positioner is supported by the circuit support; and
the electrical connector assembly is supported by the I/O positioner.

15. A test fixture according to claim 14, wherein the base comprises means for sliding the circuit support in one of the x and y directions.

16. A test fixture according to claim 15, comprising at least two circuit supports and wherein the electrical circuit comprises a substrate and at least one circuit electrical component.

17. A test fixture according to claim 16, wherein the position of the circuit support is adjustable on the base in the x and y directions according to the dimensions and shape of the circuit to be tested.

18. A test fixture according to claim 16, wherein the position of the electrical connector assembly is adjustable in the z direction on the I/O positioner to bring the electrical connector into electrical contact with the circuit electrical component and to adjust for variations in substrate thickness.

* * * * *